US011704617B2

(12) United States Patent
Lopopolo

(10) Patent No.: US 11,704,617 B2
(45) Date of Patent: Jul. 18, 2023

(54) SYSTEMS AND METHODS FOR MODELING AND ANALYSIS OF INFRASTRUCTURE SERVICES PROVIDED BY CLOUD SERVICES PROVIDER SYSTEMS

(71) Applicant: Stripe, Inc., San Francisco, CA (US)

(72) Inventor: Ryan Lopopolo, Seattle, WA (US)

(73) Assignee: Stripe, Inc., San Francisco, CA (US)

(\*) Notice: Subject to any disclaimer, the term of this patent is extended or adjusted under 35 U.S.C. 154(b) by 52 days.

(21) Appl. No.: 16/905,205

(22) Filed: Jun. 18, 2020

(65) Prior Publication Data

US 2022/0284359 A1 Sep. 8, 2022

Related U.S. Application Data

(60) Provisional application No. 62/864,095, filed on Jun. 20, 2019.

(51) Int. Cl.
*G06Q 10/067* (2023.01)
*G06F 30/20* (2020.01)
(Continued)

(52) U.S. Cl.
CPC ........... *G06Q 10/067* (2013.01); *G06F 30/20* (2020.01); *G06F 40/20* (2020.01); *G06Q 10/047* (2013.01);
(Continued)

(58) Field of Classification Search
None
See application file for complete search history.

(56) References Cited

U.S. PATENT DOCUMENTS 5,539,883 A * 7/1996 Allon .................... G06F 9/5088
370/237
5,799,286 A * 8/1998 Morgan ................. G06Q 40/02
705/30

(Continued)

FOREIGN PATENT DOCUMENTS

WO WO-2013159291 A1 * 10/2013 ............. G06F 9/505

OTHER PUBLICATIONS

Lopopolo Ray, Productive Engineering-Finance Partnership, hyperbo la webpages Oct. 27, 2018 https://hyperbo.la/w/engineering-finance-partnership/ (Year: 2018).*

(Continued)

*Primary Examiner* — Octavian Rotaru
(74) *Attorney, Agent, or Firm* — Womble Bond Dickinson (US) LLP

(57) ABSTRACT

Systems and methods for modeling and analysis of commerce platform system infrastructure provided by cloud services provider systems to a commerce platform are described. The method may include receiving a cloud services provider spending report generated by a cloud service provider system, wherein the cloud services provider spending report comprises information indicative of costs of cloud services provider resource usage by the commerce platform system over a period of time, and receiving a service report for one or more systems of the commerce platform, wherein the service report comprises information indicative of execution of services of the one or more systems of the commerce platform over the period of time. A directed graph may then be generated that models costs of commerce platform system service usage at the cloud services provider system. The method may also include performing an analysis of the directed graph to attribute cloud service provider system cost information to the commerce platform system service usage at the cloud services provider system, and (Continued)

generating a report indicating cloud service provider system costs attributable services of the commerce platform system.

20 Claims, 7 Drawing Sheets

(51) Int. Cl.
| | |
|---|---|
| *G06Q 10/10* | (2023.01) |
| *G06Q 10/047* | (2023.01) |
| *G06Q 30/0201* | (2023.01) |
| *G06Q 10/0637* | (2023.01) |
| *G06Q 10/0631* | (2023.01) |
| *G06F 40/20* | (2020.01) |
| *G06Q 30/0204* | (2023.01) |

(52) U.S. Cl.
CPC . *G06Q 10/06315* (2013.01); *G06Q 10/06375* (2013.01); *G06Q 10/10* (2013.01); *G06Q 30/0201* (2013.01); *G06Q 30/0204* (2013.01)

(56) References Cited

U.S. PATENT DOCUMENTS

| | | | | |
|---|---|---|---|---|
| 5,802,508 | A * | 9/1998 | Morgenstern | G06N 5/027 706/55 |
| 6,208,993 | B1 * | 3/2001 | Shadmon | G06F 16/30 707/999.102 |
| 6,249,769 | B1 * | 6/2001 | Ruffin | G06Q 30/0201 705/400 |
| 6,466,980 | B1 * | 10/2002 | Lumelsky | H04L 43/0882 709/224 |
| 6,578,005 | B1 * | 6/2003 | Lesaint | G06Q 10/06 705/7.14 |
| 7,870,044 | B2 * | 1/2011 | Robertson | G06Q 30/0283 705/40 |
| 7,917,617 | B1 * | 3/2011 | Ponnapur | G06F 9/45558 718/1 |
| 7,992,152 | B2 * | 8/2011 | Hashimoto | G06F 9/50 718/105 |
| 8,175,863 | B1 * | 5/2012 | Ostermeyer | G06F 11/3409 718/1 |
| 8,260,959 | B2 * | 9/2012 | Rudkin | H04Q 3/66 709/224 |
| 8,484,355 | B1 * | 7/2013 | Lochhead | G06F 9/5077 709/222 |
| 9,350,561 | B1 * | 5/2016 | Schafer | G06Q 10/06 |
| 9,384,511 | B1 * | 7/2016 | Purpus | G06F 16/2358 |
| 9,448,824 | B1 * | 9/2016 | Fitzgerald | G06F 9/5083 |
| 9,529,863 | B1 * | 12/2016 | Gindin | G06Q 40/00 |
| 9,747,635 | B1 * | 8/2017 | Ward, Jr. | G06Q 30/08 |
| 9,774,489 | B1 * | 9/2017 | Gupta | H04L 41/00 |
| 10,002,026 | B1 * | 6/2018 | Wagner | G06F 9/45558 |
| 10,067,801 | B1 * | 9/2018 | Wagner | G06F 9/5055 |
| 10,089,476 | B1 * | 10/2018 | Roth | G06Q 20/14 |
| 10,237,135 | B1 * | 3/2019 | Alabsi | H04L 43/20 |
| 11,100,586 | B1 * | 8/2021 | Wang | H01L 27/1463 |
| 2003/0083888 | A1 * | 5/2003 | Argenton | G06Q 40/02 705/400 |
| 2003/0158724 | A1 * | 8/2003 | Uchida | H04L 51/066 704/7 |
| 2003/0172018 | A1 * | 9/2003 | Chen | G06Q 40/06 705/36 R |
| 2003/0236721 | A1 * | 12/2003 | Plumer | G06Q 40/12 705/30 |
| 2004/0186762 | A1 * | 9/2004 | Beaven | H04L 67/02 705/7.27 |
| 2005/0005012 | A1 * | 1/2005 | Odhner | G06Q 10/06 709/226 |
| 2005/0120032 | A1 * | 6/2005 | Liebich | G06Q 10/04 |
| 2006/0167703 | A1 * | 7/2006 | Yakov | B23K 1/0016 705/37 |
| 2006/0212334 | A1 * | 9/2006 | Jackson | H04L 47/80 709/226 |
| 2007/0271203 | A1 * | 11/2007 | Delvat | G06Q 30/0283 705/400 |
| 2008/0065435 | A1 * | 3/2008 | Ratzloff | G06Q 10/00 705/7.37 |
| 2008/0184254 | A1 * | 7/2008 | Bernard | G06F 9/505 718/105 |
| 2008/0222638 | A1 * | 9/2008 | Beaty | G06F 9/45558 718/100 |
| 2008/0295096 | A1 * | 11/2008 | Beaty | G06Q 30/0202 718/1 |
| 2009/0018880 | A1 * | 1/2009 | Bailey | G06Q 40/04 705/7.37 |
| 2009/0063251 | A1 * | 3/2009 | Rangarajan | G06Q 30/02 705/7.31 |
| 2009/0201293 | A1 * | 8/2009 | Tung | G06Q 10/04 713/100 |
| 2009/0204382 | A1 * | 8/2009 | Tung | G06F 1/3203 703/21 |
| 2009/0216580 | A1 * | 8/2009 | Bailey | G06Q 40/02 705/7.41 |
| 2009/0231152 | A1 * | 9/2009 | Tung | G06F 1/206 340/660 |
| 2009/0276771 | A1 * | 11/2009 | Nickolov | H04L 67/1008 718/1 |
| 2009/0300173 | A1 * | 12/2009 | Bakman | G06F 11/3452 718/1 |
| 2009/0300608 | A1 * | 12/2009 | Ferris | G06F 11/301 718/1 |
| 2010/0005173 | A1 * | 1/2010 | Baskaran | G06F 9/5066 709/226 |
| 2010/0125473 | A1 * | 5/2010 | Tung | G06F 9/5072 709/200 |
| 2010/0169477 | A1 * | 7/2010 | Stienhans | G06F 9/5083 709/224 |
| 2010/0250642 | A1 * | 9/2010 | Yellin | G06F 11/3409 709/224 |
| 2010/0293163 | A1 * | 11/2010 | McLachlan | G06N 5/04 707/769 |
| 2010/0306382 | A1 * | 12/2010 | Cardosa | G06F 9/5038 718/1 |
| 2010/0318454 | A1 * | 12/2010 | Warncke | G06Q 30/00 705/37 |
| 2010/0332262 | A1 * | 12/2010 | Horvitz | G06F 9/5072 705/26.1 |
| 2011/0016214 | A1 * | 1/2011 | Jackson | G06F 9/505 718/101 |
| 2011/0022861 | A1 * | 1/2011 | Agneeswaran | G06F 9/5094 718/1 |
| 2011/0055385 | A1 * | 3/2011 | Tung | H04L 67/1097 718/1 |
| 2011/0099403 | A1 * | 4/2011 | Miyata | G06F 9/5088 718/1 |
| 2011/0145094 | A1 * | 6/2011 | Dawson | G06Q 30/06 707/E17.014 |
| 2011/0154353 | A1 * | 6/2011 | Theroux | G06F 9/5038 718/104 |
| 2011/0167034 | A1 * | 7/2011 | Knight | G06F 16/22 707/602 |
| 2011/0219031 | A1 * | 9/2011 | Chi | G06F 16/00 707/E17.012 |
| 2011/0295999 | A1 * | 12/2011 | Ferris | H04L 47/70 709/224 |
| 2012/0060142 | A1 * | 3/2012 | Fliess | G06F 11/3457 717/102 |
| 2012/0066018 | A1 * | 3/2012 | Piersol | G06Q 10/10 705/7.14 |
| 2012/0066020 | A1 * | 3/2012 | Moon | G06Q 10/0635 705/7.28 |
| 2012/0124211 | A1 * | 5/2012 | Kampas | H04L 47/80 709/226 |
| 2012/0130781 | A1 * | 5/2012 | Li | G06Q 30/0241 705/1.1 |
| 2012/0130873 | A1 * | 5/2012 | Morgan | G06Q 30/04 705/34 |
| 2012/0131161 | A1 * | 5/2012 | Ferris | G06Q 30/02 709/223 |

(56) References Cited

U.S. PATENT DOCUMENTS

| | | | | |
|---|---|---|---|---|
| 2012/0131194 A1* | 5/2012 | Morgan | G06F 9/5072 709/226 |
| 2012/0131195 A1* | 5/2012 | Morgan | G06F 9/5072 709/226 |
| 2012/0131591 A1* | 5/2012 | Moorthi | G06F 9/5088 718/104 |
| 2012/0131594 A1* | 5/2012 | Morgan | G06F 9/5072 718/105 |
| 2012/0158817 A1* | 6/2012 | Lauderdale | G06F 8/45 709/201 |
| 2012/0185413 A1* | 7/2012 | Felter | G06Q 30/0645 711/E12.001 |
| 2012/0221454 A1* | 8/2012 | Morgan | G06Q 30/06 705/37 |
| 2012/0226796 A1* | 9/2012 | Morgan | H04L 12/1453 709/224 |
| 2012/0226808 A1* | 9/2012 | Morgan | G06Q 30/04 709/226 |
| 2012/0233547 A1* | 9/2012 | McLachlan | G06Q 10/06 715/764 |
| 2012/0304170 A1* | 11/2012 | Morgan | G06F 9/45558 718/1 |
| 2012/0304191 A1* | 11/2012 | Morgan | G06F 9/5088 718/105 |
| 2012/0311106 A1* | 12/2012 | Morgan | H04L 41/0806 709/220 |
| 2012/0311153 A1* | 12/2012 | Morgan | H04L 12/00 709/226 |
| 2012/0311154 A1* | 12/2012 | Morgan | G06F 9/5072 709/226 |
| 2012/0311571 A1* | 12/2012 | Morgan | G06F 9/45558 718/1 |
| 2013/0042003 A1* | 2/2013 | Franco | G06Q 10/0633 709/226 |
| 2013/0060595 A1* | 3/2013 | Bailey | G06Q 10/087 705/7.24 |
| 2013/0179371 A1* | 7/2013 | Jain | G06F 9/5027 705/400 |
| 2013/0201193 A1* | 8/2013 | McLachlan | G06Q 40/00 345/441 |
| 2013/0282537 A1* | 10/2013 | Snider | G06Q 10/10 705/30 |
| 2013/0282540 A1* | 10/2013 | Bliesner | G06Q 20/145 705/34 |
| 2013/0346390 A1* | 12/2013 | Jerzak | G06F 16/24568 707/719 |
| 2014/0108215 A1* | 4/2014 | Kirsch | G06Q 40/04 705/37 |
| 2014/0136295 A1* | 5/2014 | Wasser | G06Q 10/04 705/7.38 |
| 2014/0214496 A1* | 7/2014 | Macbeath | G06Q 30/0283 705/7.37 |
| 2014/0278807 A1* | 9/2014 | Bohacek | G06Q 30/0206 705/7.35 |
| 2014/0278808 A1* | 9/2014 | Iyoob | G06Q 30/0206 705/7.35 |
| 2014/0279676 A1* | 9/2014 | Schafer | G06Q 10/067 705/348 |
| 2014/0310418 A1* | 10/2014 | Sorenson, III | H04L 67/1038 709/226 |
| 2015/0012328 A1* | 1/2015 | McLachlan | G06Q 10/06315 705/7.25 |
| 2015/0019301 A1* | 1/2015 | Jung | G06Q 10/06393 705/7.39 |
| 2015/0058486 A1* | 2/2015 | Huang | H04L 47/70 709/226 |
| 2015/0156065 A1* | 6/2015 | Grandhe | H04L 41/5054 709/224 |
| 2015/0188927 A1* | 7/2015 | Santhi | G06Q 10/0631 726/4 |
| 2015/0199724 A1* | 7/2015 | Negruseri | G06Q 30/0264 705/14.61 |
| 2015/0341230 A1* | 11/2015 | Dave | H04L 41/0893 705/7.29 |
| 2015/0341240 A1* | 11/2015 | Iyoob | G06F 8/60 709/201 |
| 2016/0019636 A1* | 1/2016 | Adapalli | H04L 47/70 705/26.81 |
| 2016/0253339 A1* | 9/2016 | Ambrose | G06F 3/0689 707/693 |
| 2016/0321115 A1* | 11/2016 | Thorpe | G06Q 10/0631 |
| 2016/0358249 A1* | 12/2016 | Iyer | H04L 67/10 |
| 2017/0004430 A1* | 1/2017 | Auradkar | G06Q 10/06313 |
| 2017/0060569 A1* | 3/2017 | Piccinini | G06F 8/656 |
| 2017/0083585 A1* | 3/2017 | Chen | G06F 11/3006 |
| 2017/0085446 A1* | 3/2017 | Zhong | H04L 43/0817 |
| 2017/0085447 A1* | 3/2017 | Chen | H04L 43/024 |
| 2017/0091678 A1* | 3/2017 | Ko | G06Q 10/067 |
| 2017/0091689 A1* | 3/2017 | Elliott | G06Q 10/0631 |
| 2017/0093642 A1* | 3/2017 | Chin | H04L 67/1023 |
| 2017/0093645 A1* | 3/2017 | Zhong | H04L 41/12 |
| 2017/0109815 A1* | 4/2017 | Bai | H04L 41/5029 |
| 2017/0178041 A1* | 6/2017 | Li | H04L 67/10 |
| 2017/0185929 A1* | 6/2017 | Theriault | G06Q 10/067 |
| 2018/0060106 A1* | 3/2018 | Madtha | G06F 16/951 |
| 2018/0082231 A1* | 3/2018 | Tijerina | G06Q 10/0637 |
| 2018/0137445 A1* | 5/2018 | Tijerina | G06Q 10/06313 |
| 2018/0165619 A1* | 6/2018 | Hilerio | G06Q 10/067 |
| 2018/0188899 A1* | 7/2018 | Nigam | G06Q 10/1095 |
| 2018/0321928 A1* | 11/2018 | Borthakur | G06F 21/105 |
| 2018/0332138 A1* | 11/2018 | Liu | H04L 41/5041 |
| 2018/0375787 A1* | 12/2018 | Chen | H04L 47/823 |
| 2019/0179675 A1* | 6/2019 | Srinivasan | G06F 9/5077 |
| 2020/0059539 A1* | 2/2020 | Wang | H04L 67/131 |
| 2020/0089515 A1* | 3/2020 | Hari | G06N 3/02 |
| 2020/0314174 A1* | 10/2020 | Dailianas | G06F 9/45558 |
| 2020/0314175 A1* | 10/2020 | Dailianas | G06F 9/5088 |
| 2021/0112116 A1* | 4/2021 | Baccour | H04L 65/80 |
| 2021/0182108 A1* | 6/2021 | Eberlein | G06F 11/301 |
| 2021/0200594 A1* | 7/2021 | Kobayashi | G06F 9/542 |
| 2021/0208859 A1* | 7/2021 | Kapadia | H04L 67/34 |
| 2021/0232479 A1* | 7/2021 | Sprague | G06N 5/04 |
| 2021/0240539 A1* | 8/2021 | Murthy | G06F 11/3452 |
| 2021/0255902 A1* | 8/2021 | Soon-Shiong | G06F 9/45558 |
| 2021/0256066 A1* | 8/2021 | Srinivasan | G06F 11/328 |
| 2021/0294651 A1* | 9/2021 | Misca | G06F 9/5061 |

OTHER PUBLICATIONS

Lopopolo Ryan, Effectively using AWS Reserved Instances, stripe webpages, Jun. 26, 2018 https://stripe.com/blog/aws-reserved-instances (Year: 2018).*

Lopopolo Ray, The AWS Billing Machine and Optimizing Cloud Costs, SREcon19, Asia-Pacific, Jun. 12, 2019 3PM-3 30 PM (Year: 2019).*

Ludwig Justin, EC2 Reserved Instance Break Even Points, SWWOMM webpages, Sep. 9, 2012 https://blog.swwomm.com/2012/09/ec2-reserved-instance-break-even-points.html (Year: 2012).*

Skilton et al, Building Return on Investment from Cloud Computing, The Open Group Whitepaper, mladina webpages Apr. 2010 http://www.mladina.si/media/objave/dokumenti/2010/5/31/31_5_2010__open_group__building_return_on_investment_from_cloud_computing.pdf (Year: 2010).*

Ganesan Harish, Auto Scaling using AWS, Amazon Web Services AWS, Apr. 20 2011 http://www.slideshare.net/harishganesan/auto-scaling-using-amazon-web-services-aws (Year: 2011).*

Robinson Glen, Cloud Economics—Cost Optimization (selected slides), Amazon Web Services AWS, Slideshare webpages Feb. 28 2012 http://www.slideshare.net/AmazonWebServices/whats-new-with-aws-london<br class="minwidth empty"> (Year: 2012).*

Cost Optimisation with Amazon Web Services, extracted slides, Slideshare Jan. 30 2012 http://www.slideshare.net/AmazonWebServices/cost-optimisation-with-amazon-web-services?from_search=1 (Year: 2012).*

Ward Miles, Optimizing for Cost in the Cloud (selection), AWS Summit, Slideshare Apr. 20, 2012 http://www.slideshare.net/AmazonWebServices/optimizing-your-infrastructure-costs-on-aws (Year: 2012).*

(56) References Cited

OTHER PUBLICATIONS

Deciding an Approach to the Cloud AWS Reserved Instances, Cloudyn webpages, Feb. 28, 2012 https://www.cloudyn.com/blog/deciding-an-approach-to-the-cloud-aws-reserved-instances/ (Year: 2012).*

Varia Jinesh, Optimizing for Cost in the Cloud, Amazon Web Services AWS, Apr. 26, 2012 (Year: 2012).*

Edmonds-Karp algorithm, Wikipedia.com, Apr. 14, 2022, pp. 1-3, https://en.wikipedia.org/w/index.php?title=Edmonds%E2%80%93Karp_algorithm&oldid=1082758324.

Ford-Fulkerson algorithm, Wikipedia.com, Feb. 6, 2022, pp. 1-5, https://en.wikipedia.org/w/index.php?title=Ford%E2%80%93Fulkerson_algorithm&oldid=1070199459.

Watson, Cory, "Introducing Veneur: high performance and global aggregation for Datadog," Oct. 18, 2016, pp. 1-9, https://stripe.com/blog/introducing-veneur-high-performance-and-global-aggregation-for-datadog.

"Open Census Easily Collect Telemetry like Metrics and distributed traces from your services," https://opencensus.io/.

"What is Distributed Tracing?" https://opentracing.io/docs/overview/what-is-tracing/#what-is-opentracing.

https://zipkin.io/.

* cited by examiner

SYSTEMS AND METHODS FOR MODELING AND ANALYSIS OF INFRASTRUCTURE SERVICES PROVIDED BY CLOUD SERVICES PROVIDER SYSTEMS

PRIORITY

The present application is a non-provisional of, and claims the benefit of, U.S. Provisional Application No. 62/864,095, filed Jun. 20, 2019, which is incorporated by reference in its entirety.

BACKGROUND

Cloud services provider systems are commonly used for deployment of modern software systems. Cloud services provider systems provide services and resources, such as computing processing time, storage, redundancy management, application hosting and execution, etc. for use by others for a fee. For example, a company that deploys software products to its customers may use a cloud services provider system to obtain servers to, provide hardware resources for executing the company's customer application(s), execute the company's product(s) in different geographic locations, run multiple internal and external software applications of the company on those servers, provide networking bandwidth for communication between the company's customer applications and/or company application(s), as well as other services and resources.

The aforementioned services, as well as many additional cloud computing services, are typically provided by the cloud services provider systems to companies for a fee. The fees cover various services, such as providing server instances based on server instance type, bandwidth usage for total bandwidth consumed at the cloud computing system, compute time, storage amount, etc. and accrue on a time basis, bandwidth usage basis, instance basis, service level guarantee, redundancy basis, and other factors, as well as on a combination of factors.

As the complexity of the software systems deployed by a company at a cloud services provider system increase, and as the consumer base of the company grows, the cloud services provider system fees incurred by the company will increase. At the same time, the fees may become obscured by the complex interdependent nature of the software systems deployed by the cloud services provider systems, which systems use which resources, etc. A technical problem exists for tracking usage of remote system resources at one or more cloud computing systems based on existing and potential software deployments of a company. Such tracking will give accountability and insight into the deployment and cost of a company's software system deployed using a cloud services provider system in a way that enables the company to improve software development and product deployment.

BRIEF DESCRIPTION OF THE DRAWINGS

The present disclosure will be understood more fully from the detailed description given below and from the accompanying drawings of various embodiments, which, however, should not be taken to limit the embodiments described and illustrated herein, but are for explanation and understanding only.

DETAILED DESCRIPTION

Figure 1:
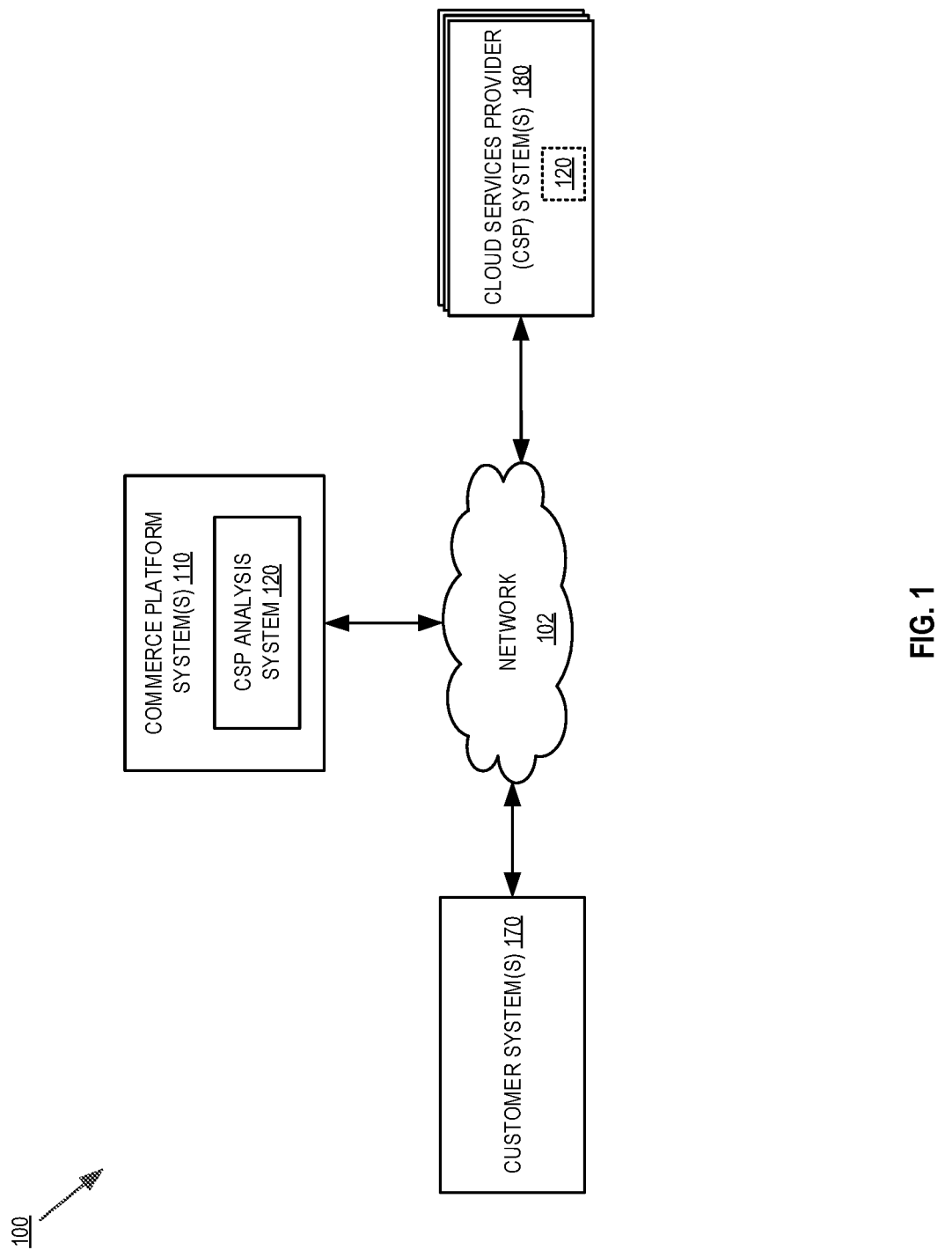
FIG. 1 is a block diagram of an exemplary system architecture for modeling and analysis of infrastructure spending by a company on services provided by cloud services provider systems to the company.

In the following description, numerous details are set forth. It will be apparent, however, to one of ordinary skill in the art having the benefit of this disclosure, that the embodiments described herein may be practiced without these specific details. In some instances, well-known structures and devices are shown in block diagram form, rather than in detail, in order to avoid obscuring the embodiments described herein.

Some portions of the detailed description that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "receiving", "analyzing", "generating", "performing", or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The embodiments discussed herein may also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the embodiments discussed herein are not described with reference to any particular programming language. It will be appreciated that a variety of programming languages may be used to implement the teachings as described herein.

FIG. 1 is a block diagram of an exemplary system architecture 100 for modeling and analysis of infrastructure spending by a company on services provided by cloud services provider systems to the company. In embodiments, the system 100 includes commerce platform system(s) 110, customer system(s) 170, and one or more cloud services provider (CSP) systems 180. In embodiments, commerce platform system(s) 110, customer system(s) 170, and CSP systems 180 are computing devices, such as server computers, desktop computers, mobile devices, etc. that include typical computing hardware (e.g., one or more processors, memory, a communications bus, a network interface, etc.), as illustrated and discussed with respect to FIG. 5 below.

The commerce platform system(s) 110, customer system(s) 170, and one or more CSP systems 180 may be coupled to a network 102 and communicate with one another using any of the standard protocols for the exchange of information. However, due to the sensitive nature of the information being exchanged during financial transactions, payment clearance, etc., in embodiments, the commerce platform system(s) 110, customer system(s) 170, and one or more CSP systems 180 may communicate with each other as discussed herein using protocols for the secure exchange of information, such as using Transport Layer Security (TLS), Secure Sockets Layer (SSL), Secure Shell (SSH), or other protocols for the secure exchange of information. In embodiments, one or more of the commerce platform system(s) 110, customer system(s) 170, and one or more CSP systems 180 may run on one Local Area Network (LAN) and may be incorporated into the same physical or logical system, or different physical or logical systems. Alternatively, one or more of the commerce platform system(s) 110, customer system(s) 170, and one or more CSP systems 180 may reside on different LANs, wide area networks, cellular telephone networks, etc. that may be coupled together via the Internet but separated by firewalls, routers, and/or other network devices. It should be noted that various other network configurations can be used including, for example, hosted configurations, distributed configurations, centralized configurations, etc.

In embodiments, commerce platform system(s) 110 provide services to customer systems(s) 170 in the form of software services. That is, customer system(s) 170 may execute software systems provided by the commerce platform system(s) 110, or may interact with software of the commerce platform system(s) 110 executed at commerce platform system(s) 110 and/or CPS system(s) 180. For example, in one embodiment, commerce platform system(s) 110 are online payments systems that provides a range of services via one or more application programming interfaces (APIs), software development kits (SDKs), web based interfaces, stand-alone applications, etc. for providing payment services for internet based commerce, including but not limited to, payment services for subscription services, on-demand marketplaces, e-commerce stores, crowdfunding platforms, sharing economy applications, etc. In one embodiment, the commerce platform system(s) 110 provide products and services such as those provided by the STRIPE™ commerce platform. Furthermore, handling payments may also refer to, for example, various payment services including clearing payments, executing charges, performing fraud checks, reconciling payments, executing refunds, vaulting card information for customers, managing agents of a customer, providing accounting and/or real-time payment analysis to customers, providing user interfaces via web pages, native applications, mobile applications, etc. That is, commerce platform systems(s) 110 provide a comprehensive set of tools, applications, interfaces, etc., referred to herein as products and/or services of the commerce platform system(s) 110, enabling the processing and management of payments for customer system(s) 170.

In embodiments, the infrastructure of commerce platform system(s) 110 that provides the various payment services to customer system(s) 170 is executed by hardware computing resources of CSP system(s) 180. That is, CSP system(s) 180 provide the hardware resources, such as server hardware (e.g., CPU, memory, etc.), server instances, data storage, network bandwidth, application execution, etc. that execute and are consumed by the services of the commerce platform system(s) 110 when providing various payment services to customer system(s) 170. For example, the comprehensive set of payment services provided by commerce platform system(s) 110 to customer system(s) 170 are executed at the CSP system(s) 180. The CSP system(S) 180 may be the same CSP (e.g., different servers of the same CSP distributed, such as servers distributed geographically, servers providing different resources, etc.) and/or CSP system(s) 180 may be different CSPs (e.g., different servers of different CSPs providing different services, serving different geographic regions, etc.)

As discussed herein, each service provided by a CSP system to support the payment products and services of the commerce platform system(s) 110 has an associated cost that may be accrued on a periodic (e.g., time based, resource based, bandwidth based, etc.) basis. However, there is a technical problem of determining how the commerce platform system(s)' 110 various products, APIs, SDKs, services, applications, customers, etc. are contributing to an overall spend at the CSP system(s) 180. For example, at any given time, commerce platform system(s) 110 services being deployed by customer system(s) 170, as well as internal services deployed by commerce platform system(s) 110 to support the services provided to customer system(s) 170, may include the instantiation and usage server instances (e.g., hardware, memory, software, networking, etc. resources) for various commerce platform software systems, where the server instances execute software systems, consume compute time, consume bandwidth, allocate and consume memory, etc. of the commerce platform system(s) 110. Because CSP system resources may be consumed dynamically, for example in response to system loads, what commerce platform system(s) 110 are currently running (e.g., customer-facing services, internal services, or a combination), time of day, etc. the cost of those services and attribution to the various products provided by the commerce platform system(s) 110 is very difficult to determine.

The cost of goods sold (COGS) measures the variable cost to deliver a product to users, which can include the cost of technology infrastructure from a cloud provider system in delivering a product to a user. For companies providing commerce platform system(s) 110, which may be built and/or deployed using CSP system(s) 180, cloud spend (e.g., the cost accrued by using the resources of the CSP system(s) 180) is a significant component of COGS for the commerce platform system(s) 110, and managing cloud spend can significantly impact the execution of the company's systems. However, accurately modeling cloud spend in modern infrastructures to attribute cost to product, teams, etc. is a complex, multivariate, and technical problem for engineering and finance teams to solve. However, cloud computing introduces predictable pricing dynamics, enabling a cloud services provider (CSP) analysis system 120 to build a global model for how software runs on metered infrastructure resulting in a determination of cloud spend, from which software deployment decisions and actions can be made to reduce costs and/or improve deployment efficiency.

In most companies, such as a company deploying the commerce platform system(s) 110, a finance team is the first to ask the question "how much does our product cost to serve?" In embodiments, a CSP analysis system 120 executed by the commerce platform system(s) 120, the CSP system(s) 180, or a combination, measures cost and/or performance, which in a cloud environment can be aligned to answer the question as to how much a product costs to deploy, how much it costs to deploy to a specific customer, how much a specific team, code path, internal system, etc. contributed to a product cost or overall cloud spend, etc., as discussed herein. Then, the technical problem of tracking complex software deployments at CSP system(s) 180 can be modeled for cloud spend analysis and action using technical solutions discussed herein. Beneficially, when it is identified by CSP analysis system 120 what the products of commerce platform system(s) 110 cost to serve and support customer system(s) 170 using the paid resources of CSP system(s) 180, different teams associated with the commerce platform can optimize their operations, including: (1) finance teams can accurately model financial forecasts, allocate costs, and establish capacity planning for a cloud fleet; (2) product engineering teams can independently design features to grow margin; (3) infrastructure engineering teams can improve inefficient areas of infrastructure; (4) leadership can identify the ROI for each product to make efficient investments for future company growth; (5) sales teams can provide intelligent deal pricing to enterprise customers and understand the underlying infrastructure cost to support each user; (6) marketing teams can improve product conversion and their go-to-market decisions; and as well as other teams within the commerce platform deploying services of the commerce platform system(s) 110.

Companies, such as the commerce platform deploying services of the commerce platform system(s) 110, generally follow two phases when building software to be used by or support services provided to customer system(s) 170 using the CSP system(s) 180. In a first phase, the companies determine the engineering requirements to practically deploy their infrastructure using the CSP system(s) 180, introducing distributed services, application architecture, operational tooling, etc. Over time, the companies will encounter changes in expected costs and unexpected costs for their cloud-based architecture deployed using CSP system(s) 180, and then invest in categorizing and analyzing their cloud spend. With one or more well-defined models generated by CSP analysis system 120, the companies (e.g., the commerce platform deploying services of the commerce platform system(s) 110) can make design and implementation decisions for improving software projects guided by their new awareness of product cost using the CSP system(s) 180 in a second phase.

In one embodiment, CSP analysis system 120 utilizes graph theory techniques to effectively determine which commerce platform system 110 products consume cloud resources at the CSP system(s) 180, and their underlying costs. By tracing the cost of each cloud component (e.g., a service instance, bandwidth consumption, memory allocation, etc. at the CSP system(s) 180) through the product infrastructure (e.g., interconnected software products, APIs, SDKs, code paths, methods, teams associated with one of these, etc.), CSP analysis system 120 can model cost attribution.

In one embodiment, the modeling is performed as a maximum flow problem. By utilizing CSP analysis system 120 to model cloud spend at CSP system(s) 180 at different levels of granularity, CSP analysis system 120 can identify how each of the software design choices, deployments, usage over time, products, etc. impact revenue margin on a granular basis, which can be used in a product development cycle by engineers of the commerce platform system(s) 110 to help make smarter decisions for execution of remote deployment to CSP system(s) 180 as new products (e.g., software systems that are used by customer system(s) 170, support those systems used by customer system(s) 170, and/or are internal systems supporting the operations of commerce platform system(s) 110) are being built and/or existing products are being refined.

It will be described herein the impact that accurate cost attribution can have on commerce platform system(s) 110, how a flow network can be used by the CSP analysis system 120 to accurately model infrastructure, and how cloud spend is attributed to products of the commerce platform system(s) 110 for refining CSP based deployments.

In embodiments, CSP analysis system 120 includes hardware, software, firmware or a combination executed by commerce platform system(s) 110, CSP system(s) 180, or a combination of systems to build a flow network modeling cloud infrastructure. A graph is a collection of related nodes, and the relationship between any two nodes is called an edge. A flow network, also called a transportation network, is a graph where all the edges are directed, one-way relationships, and the edges have a capacity associated with them. An illustrative example of a flow network is the street grid in downtown Manhattan, where each intersection is related to the others by a series of one-way roads and each road has a maximum capacity for traffic. A similar flow network, as discussed herein, is constructed by CSP analysis system 120 to model the flow (e.g. usage) of CSP system 180 resources by the interconnected products of commerce platform system(s) 110, and which products rely on other products. One example of a constructed flow network that models infrastructure of commerce platform system(s) 110 for which the maximum flow problem has been solved is illustrated in FIG. 3B.

An optimization problem associated with flow networks is determining the maximum capacity the network can support between two nodes (e.g. using the illustrative example above, the total volume of traffic the Manhattan street grid supports between a start and destination intersection). In other words, CSP analysis system 120 utilizes the maximum flow problem to determine and optimize how much flow can be pumped through the graph from a source (e.g., a node with no incoming edges) to a sink (e.g., a node with no outgoing edges).

The maximum flow problem is solvable using graph theory analysis techniques if the graph being analyzed (e.g., a graph modeling resource usage of products of the commerce platform system(s) 110) includes one source and one sink. In embodiments, the cloud infrastructure utilized by the products of commerce platform system(s) 110 serves multiple products to multiple customer system(s) and changes dynamically over time, which can result in multiple sinks. In embodiments, the model of generated by CSP analysis system 120 modifies the interconnected products deployed by commerce platform system(s) 110 to simulate only having one sink, referred to herein as a super sink.

Returning to the illustrative example of Manhattan's street grid, suppose it is desirable to measure how much traffic could leave Manhattan via two locations, the Lincoln Tunnel and Manhattan Bridge (e.g., two potential sinks), starting from the Federal Reserve Bank in the Financial District. The Lincoln Tunnel and Manhattan Bridge could be connected to a new node called Not Downtown Manhattan with these edges given infinite capacity. The new Not Downtown Manhattan node would be a new super-sink that is appropriate to use for computing the maximum flow over the tunnel and bridge combined (e.g., results in a graph with one source and one sink, and interconnected nodes between the source and sink nodes.

In embodiments, attributing costs incurred at the CSP system(s) 180 to products of the commerce platform system(s) 110 can be determined as a maximum flow problem utilizing a flow graph generated from the products and services of the commerce platform system(s) 110. That is, the volume of commerce platform system(s)' 110 spend for deployment of products at CSP systems(s) 180 is pumped through a graph that models the cloud infrastructure of commerce platform system(s)' 110 products, so that CSP analysis system 120 can compute the infrastructure margin for individual products. For example, the infrastructure margin enable the various groups discussed above (e.g. finance teams, engineering teams, etc.) to determine where the most highly concentrated costs are with respect the infrastructure of the commerce platform system(s) 110 in comparison to the amount eared from customers for usage of those products.

In embodiments, the model constructed by the CSP analysis system 120 utilizes CSP system(s) 180 as the source (e.g., Amazon Web Services, Microsoft Azure, Google Cloud, Alibaba Cloud, Oracle Cloud, IBM cloud, etc.), the sinks and intermediate nodes are all of commerce platform system(s) 110 products, which are connected to a super-sink. FIG. 3B illustrates a constructed directed graph of nodes (e.g., sigmaquerybox node, hadoopdatanode, trainingbox node, etc.) of the products of commerce platform system(s) 110 in a directed and weighted graph from a source (e.g., the CSP node 360) to a super sink (e.g., the CP node 370). The nodes in between source and sink nodes are nodes reflecting commerce platform system(s) 110 infrastructure in the form of, for example, cloud services, individual servers provisioned at a cloud system, Kubernetes pods, batch jobs, compute clusters, specific application services, etc.

In one embodiment, the nodes and their interconnection are configured in a model to be analyzed by CSP analysis system 120 based on the design infrastructure of the products of the commerce platform system(s) 110, and for which usage is being metered. That is, for example and with reference to FIG. 3B, based on design, engineering, or other documentation and architecture of the products of commerce platform system(s) 110, the nodes and their directed connections can be specified in a flow graph, such as the node illustrated as sigmaquerybox flowing to the hadoopdata node and the sigma node, the dashboardweb node flowing to the dashboard node, the trainingbox node flowing to the fraud-feature-gen node, etc. Furthermore, in embodiments, the services represented by the nodes are metered, e.g., their usage is monitored over time by the CSP system(s) 180, internal tracking performed by commerce platform system(s) 110, or a combination.

After definition of the flow model, including a source (e.g., CSP system(s) 180), a super-sink (e.g., commerce platform system 110), and intermediate nodes flowing from the source to the super sink, CSP analysis system 120 determines each edge's capacity as the total resources consumed between two nodes, which can vary over time. For example, a first service of the commerce platform system(s) 110 consumes spend/resources of the CSP system(s) 180, and a second service may consume time from individual jobs of the first service. Pumping the maximum possible flow through a graph ensures the model generated by CSP analysis system 120 mirrors the real-world costs billed by a CSP system(s) 180 for usage by the infrastructure of the commerce platform system(s) 110. In embodiments, if the model's cost flowing through an edge is less than the edge's potential maximum capacity, the analysis by CSP analysis system 120 will not accurately capture the cost for that cloud component.

In embodiments, CSP analysis system 120 therefore models costs for commerce platform system(s) 110 products attributed cloud spend. As discussed above, FIG. 3B illustrates an example of a flow network modeling cloud infrastructure spend trickling down to all products left to right. In embodiments, each edge in the flow network is labeled by CSP analysis system 120 with the type of cloud resource that is attributed to cloud spend between two nodes, and may have the following properties including timestamp, cloud component (source) (e.g., CSP), consumer (sink) (e.g., a service such as hadoopdatanode), a SKU (edge label) (e.g., USW2-BoxUsage:i3.4×large), and Cost (amount× rate=capacity).

In embodiments, each component (e.g., resource) of the CSP systems(s) 180 that may be used by the products of the commerce platform system(s) 110 has a stock keeping unit (SKU) (e.g., a unique identifier for the component), and may be used in different quantities by various products of the commerce platform system(s)' 110 infrastructure. In embodiments, CSP analysis system 120 periodically receives cost and usage reports of the CSP system(s) 180, where the SKU has a lineitem/UsageType field (or usage type) listed in the reports. Furthermore, some CSP system(s) 180 bill instance usage by the second, so an example of server time consumed on a c5.9×large instance in the us-west-2 region in a report of CSP system(s) 180 would have a SKU of USW2-BoxUsage:c5.9×large.

In embodiments, CSP analysis system 120 further receives internal services reports of the products of commerce platform system(s) 110, which use different units depending on the type of service. For example, commerce platform system(s) 110 may include an observability infrastructure that records a number of different time series streams to track usage of products, APIs, SDKs, methods, code paths, etc. across the platform in the graph model generate by CSP analysis system 120 with a single edge per stream labeled with a SKU called, for example, veneur:metric-time-series.

In embodiments, CSP analysis system 120 tracks cloud spend across multiple dimensions, and may therefore use the same/different models to model different aspects of cloud spend. For example, CSP analysis system 120 can examine the cost to serve, for example, EC2 instances, can examine the cost to serve an individual job in a cluster used by commerce platform system(s) 110. To establish a complete picture of infrastructure spend, CSP analysis system 120 attributes each platform/product/etc. to its downstream consumers until their use can ultimately be attributed to one product. For some shared infrastructure at the commerce platform system(s) 110, CSP analysis system 120 iterates through several layers of downstream consumers to attribute infrastructure spend to an individual product. For example, a service referred to as Dashboard (e.g., a user interface) can consume multiple services:

AWS→EC2→Hadoop→Job→Stream Aggregator→
Job→dashboard.stripe.com

In embodiments, CSP analysis system 120 extends this attribution analysis with one more layers to attribute the cost of products of the commerce platform system(s) 180 to individual commerce platform system users (e.g., a customer associated with one or more customer system(s) 170, such as a specific customer using the Dashboard). By associating cloud spend with individual users, CSP analysis system 120 computes the infrastructure margin associated with individual merchants/customers using the product(s) of the commerce platform system(s) 110. Attributing cloud spend this way enables CSP analysis system 120 to identify the precise breakdown of infrastructure spend, and where an effort can be applied by the commerce platform to grow margin, to aggregate COGS for cloud based infrastructure, etc. For example, different teams of the commerce platform, such as infrastructure engineers using the model to identify inefficient areas of infrastructure for improvement based on cost/performance, product engineers using the model to optimize feature design and development to improve margin, finance teams using the model to optimize financial predictability, forecasting, and capacity modeling, sales teams to optimize deal pricing based on past modeling and/or predicted modeling, and leadership within the commerce platform using the model to identify a return on investment of reach product when deciding how to invest in future growth, etc.

In embodiments, as discussed herein, CSP analysis system 120 therefore models infrastructure of the commerce platform system(s) products, services, etc. as a graph. In distributed computing, graph analysis is often used for distributed tracing so that operational metrics can be unified for an entire system across service boundaries (e.g., for the products, services, APIs, SDKs, etc. forming the collected infrastructure of the commerce platform system(s) 110). In embodiments, tools such as Veneur with SSF, Zipkin, OpenCensus, OpenTracing, or the like, may be used to measure the cost of a product based on total CPU resources or wall clock time spent.

By CSP analysis system 120 treating the system of commerce platform system(s) 110 products as a graph, CSP analysis system 120 may modifying the capacities of each edge. In larger organizations, the chargeback and showback model is used to manage infrastructure spend across business units. For example, one infrastructure team (e.g., a team at the commerce platform) will charge other internal customers (e.g., other teams, users, services, etc. of the commerce platform) for deployed services, for example using the CSP system(s) 180. With this structure, IT teams can economically incentivize the adoption of an upgraded continuous integration (CI) cluster by offering it to the rest of the organization at a loss. In embodiments, commerce platform system(s) 110 may rely on showback reporting so teams have observability into their total impact on cloud spend.

Another benefit to CSP analysis system 120 modeling commerce platform system(s) 110 infrastructure as a graph is that CSP analysis system 120 can identify technical dependencies that may not be reflected through the internal communication channels or a predefined organizational structure. For example, CSP analysis system 120 may find that a heavily-used service is owned by multiple teams and would benefit from one long-term owner who can optimize it to ensure each service can be tied to a single cost center.

In embodiments, by CSP analysis system 120 tracking resource usage as a graph, code can be linked to its product owner. For example, a Kubernetes pod may correspond to a specific code artifact. CSP analysis system 120 can trace the attribution graph downstream to identify products with the code artifacts they depend on. This approach ensures that product teams are well-represented when relevant infrastructure decisions and upgrades are made based on the reflected cloud spend attributed to code by CSP analysis system 120.

In embodiments, CSP analysis system 120 therefore attributes costs to cloud services provided and charged by CSP system(s) 180. In embodiments, commerce platform may classify services in the infrastructure of the commerce platform system(s) 110 into two categories. First, application services are owned by one team and support one product of the commerce platform system(s) 110. These services are attributable to cloud spend by CSP analysis system 120 because they map one-to-one to a product (e.g., may be correlated by analysis of a cloud spend report with product usage reports). For example, an example application service of the commerce platform system(s) 110 may generate subscription invoices for billing of customers by the commerce platform. Second, platform services, in comparison to application services, are owned by one team, but are used across multiple products (e.g., could be used by a subscription reporting service as well as one or more other services). Platforms are more challenging to attribute because they map to two or more products. In embodiments, CSP analysis system 120 utilizes metered resource usage (e.g., tracking of usage of a platform product across different services by systems of the commerce platform) to attribute costs:

e.g. EC2→Hadoop→Job→Stream Aggregator→
Job ↝ Dashboard

In embodiments, CSP analysis system 120 utilizes the Edmonds-Karp technique for solving the maximum flow problem for usage across different services. CSP analysis system 120 applies the Edmonds-Karp technique to compute the maximum flow between a source and a sink in determining the commerce platform system(s) 110 modeled cost graph. Other techniques, such as the Ford-Fulkerson technique, may also be used. Because the infrastructure of the commerce platform system(s)' 110 products are broken into layers, CSP analysis system 120 decomposes the graph into subgraphs by layer and executes the Edmonds—Karp technique iteratively until CSP analysis system 120 obtains a product. Decomposing the graph into layers simplifies the graph of the commerce platform system(s) 110 services to a degenerate case for the Edmonds-Karp technique—the path length from source to super-sink will be 2 after decomposing, which means to compute the flow to any sink, the CSP analysis system 120 sums the capacities of all the edges pointed at the sink.

By the CSP analysis system 120 solving Edmonds—Karp iteratively, several benefits are achieved. First, it enforces that each edge of the commerce platform product usage model is at capacity when CSP analysis system 120 solves the network for a single layer and prevents the CSP analysis system 120 from having unattributed spend. Additionally, breaking apart the layers means that CSP analysis system 120 can use different units in each layer of the graph. For example, CSP analysis system 120 can attribute spend at the cloud services platform(s) 180 in dollars to database machines, but attribute table bytes on disk to application services that consume the database. Decomposing the problem also makes it easier to incrementally add attribution by the CSP analysis system 120 for new services/products of the commerce platform system(s) 110, and increase the coverage of the infrastructure.

To accurately model cloud computing spend using a flow network, the edges and nodes are accurately defined by the CSP analysis system 120. In embodiments, definitions are pulled for these by extracting line items for the resources being metered, such as from a cost and usage report received from the CSP system(s) 180 and/or a job history log from a job tracker employed by the commerce platform system(s) 110 to track product/service usage.

In embodiments, when constructing the flow network from the reports, CSP analysis system 120 utilizes a measure of usage for a service, where the measure of usage is a constrained resource (e.g. CPU time, request volume, bytes on disk, job execution time). The usage information can be obtained over time based on the report's cost and usage report received from the CSP system(s) 180 and/or a job history log from a job tracker employed by the commerce platform system(s) 110 to track product/service usage.

Once CSP analysis system 120 has solved the flow network, CSP analysis system 120 can transform the results to generate reports that provide observability for costs incurred by the products of the commerce platform system(s) 110. In embodiments, the flow network may be transformed into one or more reports, including an attribution report detailing the flow from source to sink indicating how much a product costs (e.g., cloud spend for the product), an edge report detailing the flow from a source to the total set of edge labels indicating, for example, how much an i3.4×large instance costs, an attribution edge report that details the set of total combinations of the flow from source to each SKU used, grouped by product, such as for example which products use the most i3.4×large instances.

Figure 6:
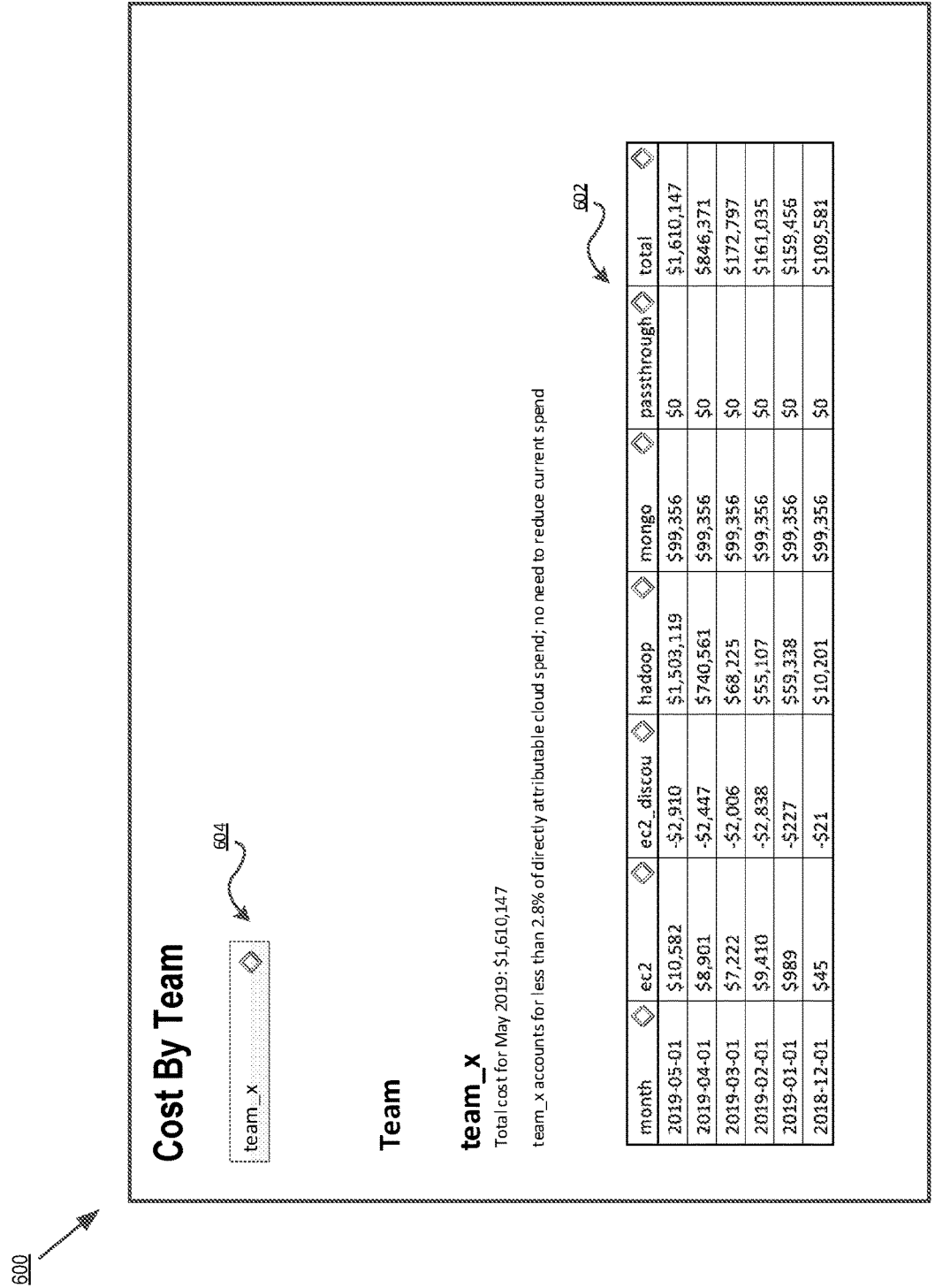
FIG. 6 is one embodiment of a graphical user interface generated using a graph modeling infrastructure spending by a company on services provided by cloud services provider systems.

Based on the reports, CSP analysis system 120, or one or more users of the commerce platform system(s) 110 (e.g., finance, leadership, engineering, efficiency, or other tea members), may determine how to adjust resource deployment to reduce cloud spend such as, for example, reduce determined inefficiencies, deploy products to different CSPs to use more efficient cloud resources, adjust CSP deployment to increase margin for a product, etc. That is, the reports may be used by the commerce platform system 110 to cause changes in the deployment and execution of the products of the commerce platform system 110 to reduce costs and/or improve performance of those systems. In embodiments, CSP analysis system 120 generates one or more graphical user interfaces, an embodiment of which is illustrated in FIG. 6. In the embodiment, the graphical user interface 600 may represent a scorecard (e.g., a user interface generated and displayed to the one or more users, posted to an intranet web page, a metrics platform accessible to employees of the commerce platform system(s) 110, etc.) detailing cloud spend for services and/or teams so that they can independently optimize their product. One embodiment of a scorecard user interface 600 generated by CSP analysis system 120 is a monthly snapshot 602 of how a selected team 604 (e.g., team_x) and their associated usage of an exemplary set of different products at CSP system(s) 180 consume infrastructure services (e.g., in the snapshot generated on May 1, 2019, ec2 server instances attributable to team_x as determined from the graph analysis discussed herein totaled $10,582). Such a user interface may be published on a company-wide metrics platform, accessible to different departments/employees of a commerce platform involved with product development, management, planning, sales, etc. In embodiments, such a user interface could show that scaling out a service that supports growth in a specific service area and resulting in increased costs is done with the expectation that this growth in infrastructure aligns with growth in usage by customer system(s) 170. If a team or product's spend suddenly accelerates (e.g., such as Hadoop cloud spend from Mar. 1, 2019 to Apr. 1, 2019 as illustrated in FIG. 6), CSP analysis system 120 can generate a low-priority alert to investigate the change and engage (e.g., alert, message, etc.), for example, an efficiency engineering team. For example, CSP analysis system 120 could trigger such an alert if a database migration unexpectedly increases the size of a table. In embodiments, both user interfaces are generated by CSP analysis system 120 with a batch process (e.g., scripted execution of a scorecard generation process) that consumes the cost graph generated by CSP analysis system 120. The generation of the scorecard user interfaces, reports, trend analysis, historical views, and any resulting notifications, alerts, etc., may be performed on a periodic basis by CSP analysis system 120 to capture and detect any trends that may be significant to cloud spend by the commerce platform system(s) 110. In embodiments, the period in which reports, trend analysis, user interface updates, etc. are generated may be periodic intervals, as well as on-demand updates.

In embodiments, to influence behavior of, for example, developers, project managers, etc. employed by the commerce platform to create, refine, and maintain products of the commerce platform system(s) 110, in embodiments, CSP analysis system 120 can change these scorecard reports over time. In embodiments, the scorecard changes (e.g. graphical user interface snapshot detailing cloud spend) may reflect evolving strategies, goals, etc. of the commerce platform (e.g., reduce spend on specific server instances, reduce bandwidth consumption by a product, weigh cost of legacy hardware which is more costly to maintain). By making these changes (e.g., increase the internal cost of an m3.large SKU when CSP analysis system 120 generates a cost graph and/or scorecard report) to influence behavior of the commerce platform system development and employees. For example, a changed cost associated with usage of a specific service instance (e.g., m3.large) as reflected in the cost graphs and reports generated by the CSP analysis system 120, could influence design and engineering choice to use a less expensive server instance (e.g., m5d.large). As another example, usage of more efficient platforms like Kubernetes can be encouraged by pricing machine learning workloads and jobs that run on that platform more cheaply in the cost graphs and reports generated by the CSP analysis system 120.

In embodiments, the output of the commerce platform system(s) 110 infrastructure treated as a graph (e.g., FIG.

3B) is a spanning tree of the product(s) of the commerce platform. A spanning tree of a graph enables any node to be reached in a graph. In embodiments, solving the cost attribution flow network by the CSP analysis system 120 acts somewhat like a spanning tree by providing insight into how all of the components of commerce platform system(s) 110 infrastructure interact with and depend on each other. The more layers that are added to the cost graph, the more complete of a spanning tree CSP analysis system 120 can create. Furthermore, the spanning tree represents the most optimal way to traverse the graph of infrastructure and cloud resources.

By treating cloud infrastructure used by the products/services of the commerce platform system(s) 110 as a graph, CSP analysis system 120 is able to measure how much products cost to serve to customer system(s) 170, specific customers, etc. using a flow network. Furthermore, the cost graph can be constructed by ingesting and extracting cost and usage reports received from a cloud services provider and/or from internal (commerce platform) tracking systems. Creating a total graph (e.g., one that attributes costs from each SKU extracted from a CSP system 180 report) provides an exact inventory of all resources consumed at a CSP system 180. The cost graph is a point of leverage for changing how the commerce platform thinks about costs incurred by cloud spend, and creates one global view of the commerce platform's infrastructure, how all of the pieces of a product/service fit together, and the cloud spend cost attributable to each. The flow network graph/map of the infrastructure, scorecard or snapshot reports, spanning tree decompositions, etc. of the infrastructure makes it easier to discover opportunities for optimization and cost savings. With a full picture of how commerce platform system(s)' 110 products and services consumes cloud resources, efficiency engineering is empowered to make global, whole program optimizations like centralized purchasing, leveraged negotiations, etc.

Furthermore, the techniques discussed herein enable a predictable, systematic way to measure, analyze, and drive organizational change based on how a product/service uses the cloud as determined from the cost graphs, reports, weightings, changes, etc. For example, from the generated flow graph for which the maximum flow problem has been solved, a number of the most expensive resources used by the commerce platform system(s) 110 products and services can be identified for analysis and/or optimization on a rolling basis to reduce costs. Such expenses can expose inefficiencies (e.g. processing, resource allocation, etc.) in the deployment of commerce platform system(s) 110 products as reflected by the determined costs. Thus, the cost reports enable commerce platform system 110 to dynamically and/or periodically change deployments to reduce inefficiencies (e.g., reduce unnecessary storage usage, change deployments to more efficient systems, etc.). In embodiments, such reports may be used to actively configure systems/products of the commerce platform system, such as by reverting to prior configurations when cost increases attributable to usage increases exceed preset thresholds.

Furthermore, although discussed in the context of commerce platform system(s)' 110 utilizing of resources of CSP provider system(s) 180, any system, organization, cloud based application, cloud based infrastructure, etc. that utilizes the services and/or resources of cloud services provider system(s) 180 may utilize the techniques discussed herein. Additionally, the techniques may be applied to any combination of cloud services, as well as combinations of different cloud services providers.

Figure 2:
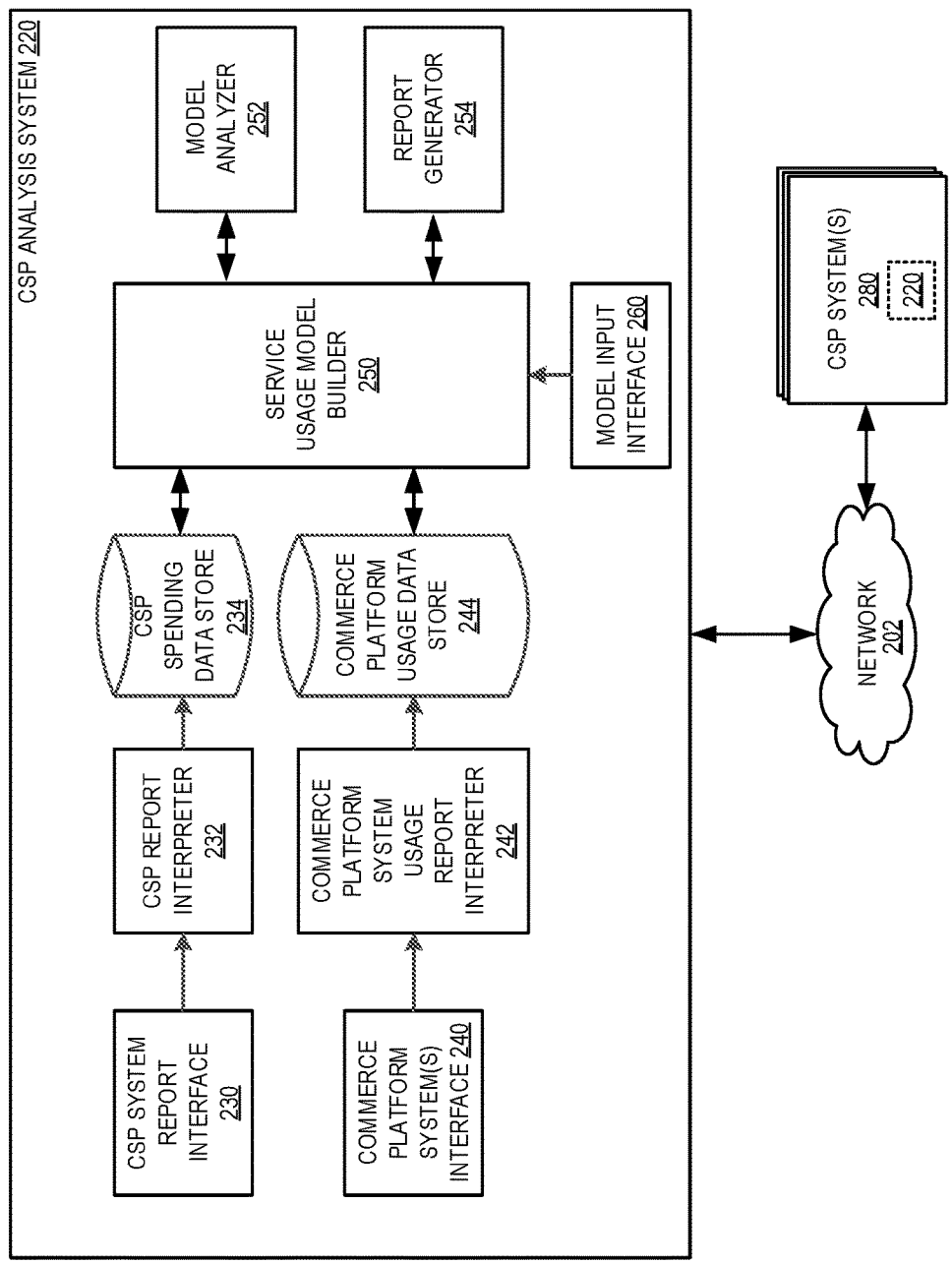
FIG. 2 is a block diagram of one embodiment of a cloud services provider analysis system.

FIG. 2 is a block diagram of one embodiment 200 of cloud services provider (CSP) analysis system 220. As discussed herein, CSP analysis system 220 constructs a cost graph that models cloud spend by the products and/or services of a commerce platform using graph theory techniques, such as solving maximum flow problems, decomposing a cost graph into spanning trees, extracting paths for specific services/products/teams/code/etc. to provide rich insights into cloud spend. In embodiments, CSP analysis system 220 may be executed by commerce platform system 110, a CSP system 180, distributed between systems, different instances operating simultaneously at different systems, etc. Furthermore, CSP analysis system 220 provides additional details for the CSP analysis system 120 discussed above in FIG. 1.

Figure 5:
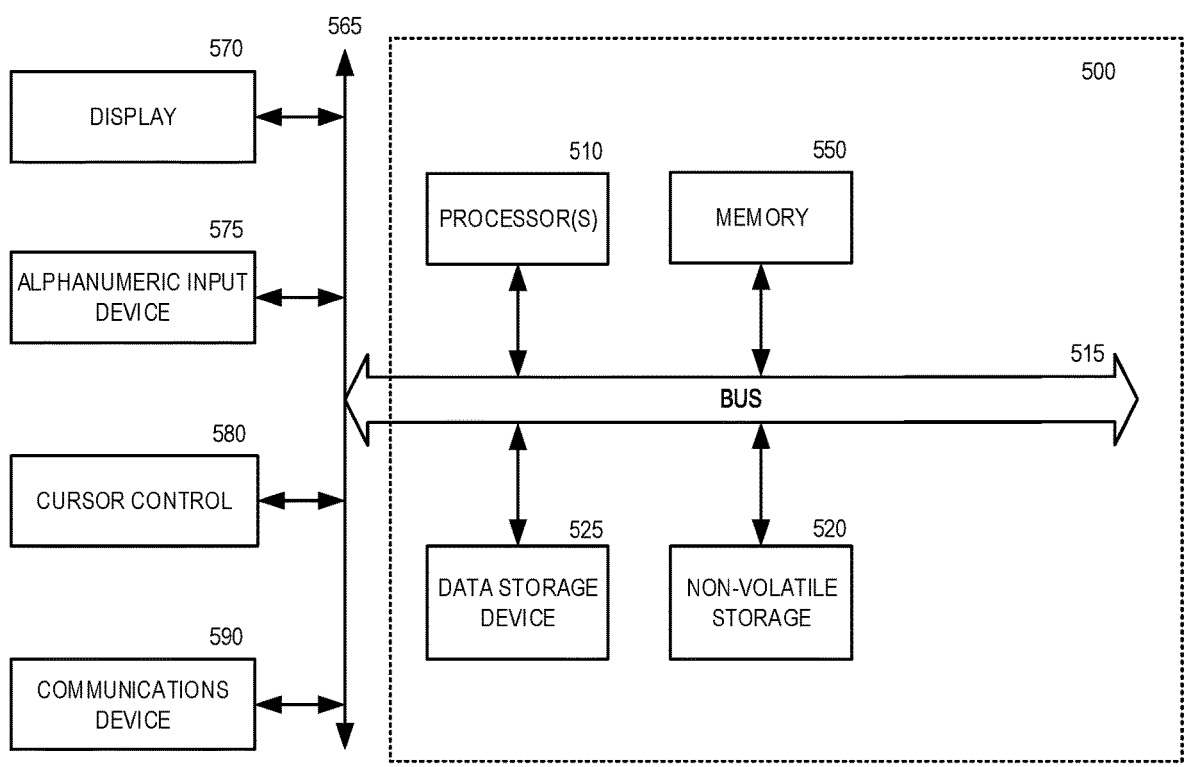
FIG. 5 is one embodiment of a computer system that may be used to support the systems and operations discussed herein.

In one embodiment, CSP analysis system 220 may include a number of processing modules. It should be appreciated that embodiments of the invention as described herein may be implemented through the execution of instructions, for example as stored in a memory, and executed by processor(s), and/or other circuitry. Particularly, CSP analysis system 220 may operate under the control of a program, routine, or the execution of instructions to execute methods or processes in accordance with embodiments of the invention to perform the operations described herein. For example, such a program may be implemented in firmware or software (e.g. stored in a memory) and may be implemented by processors and/or other circuitry. Further, it should be appreciated that the terms processor, microprocessor, circuitry, controller, etc., may refer to any type of logic or circuitry capable of executing logic, commands, instructions, software, firmware, functionality and the like. FIG. 5 illustrates an embodiment of a system that may be used to implement CSP analysis system 220.

CSP analysis system 220 includes a CSP system report interface 230 and a commerce platform system(s) interface 240. Both of these interfaces are configured to receive periodic reportings, such cost and service reports generated by cloud services providers and/or product usage reports generated by tracking software of commerce platform system(s) 110. Interpreters 232 and 242 may then analyze the reports, such as by performing textual analysis, data extraction, etc. to extract various data from the reports including SKUs for services of a cloud services provider system (e.g., to be used as graph edge labels, such as USW2-BoxUsage; i3.4×large), a time (e.g. a timestamp), an associated cost of the service, a consumer/sink (e.g., based on the report form the CSP, from a coincidence of resource usage reports with times associated in CSP reports, etc.), a cloud component (e.g., a source), etc. This extracted data is then stored in a CSP spending data store 234 and commerce platform usage data store 244.

Service usage model builder 250 then periodically builds a flow graph modeling the cloud spend of commerce platform system(s) 110. In embodiments, the nodes and connections there between may be pre-defined based on the products/services provided by commerce platform system(s) 110 to customers and/or products/services that otherwise support ongoing operations of the commerce platform system(s) 110. In other embodiments, the service reports may be used to determine what products/services rely on other products/services. Service usage model builder 250 accesses the data stores 234 and 244 to complete the flow graph by labeling nodes, edges, and attributing costs to edges. In embodiments, the source (e.g., a cloud services provider), sinks/nodes, and edge labels are obtained from the data extracted from the received reports. Service usage model builder 250 further adds edge capacity to the edges by determining (amount×rate)=capacity (e.g., 0.52 instance hours×$1.248/instance house=$0.64896).

Model analyzer 252 then performs one or more graph analysis techniques, such as the Edmonds—Karp to solve the maximum flow problem within the generated flow graph, as well as generation of spanning trees from the generated graph. From this, report generator 254 may generate one or more reports, such as scorecard/snapshot reports that detail cloud spend by the commerce platform as a whole (e.g., total cloud spend), product cloud spend (e.g., cloud spend that can be traced using the graph to a product), team cloud spend (e.g., cloud spend where product spend can be attributed to teams responsible for those products), code paths (e.g., tracing a code path alone each node in the graph to identify its eventual product owner), etc. In embodiments, the reports are formatted for publication on an internal metric tracking system, in messages to be transmitted to commerce platform efficiency teams, etc. In embodiments, the reports may be generated periodically (e.g., hourly, weekly, monthly, etc.), as well as on demand. Furthermore, using the spanning trees generated by model analyzer 252, specific reports may be requested on demand.

In embodiments, model input interface 260 may receive input from one or more users of a commerce platform editing factors used in generating capacity of edges in the flow graph. For example, received input may apply weighting to undesirable cloud spend (e.g., increasing cost associated with legacy system usage) to encourage adoption of different behavior (e.g., development and/or usage of alternative systems and/or products that are less expensive).

Figure 3A:
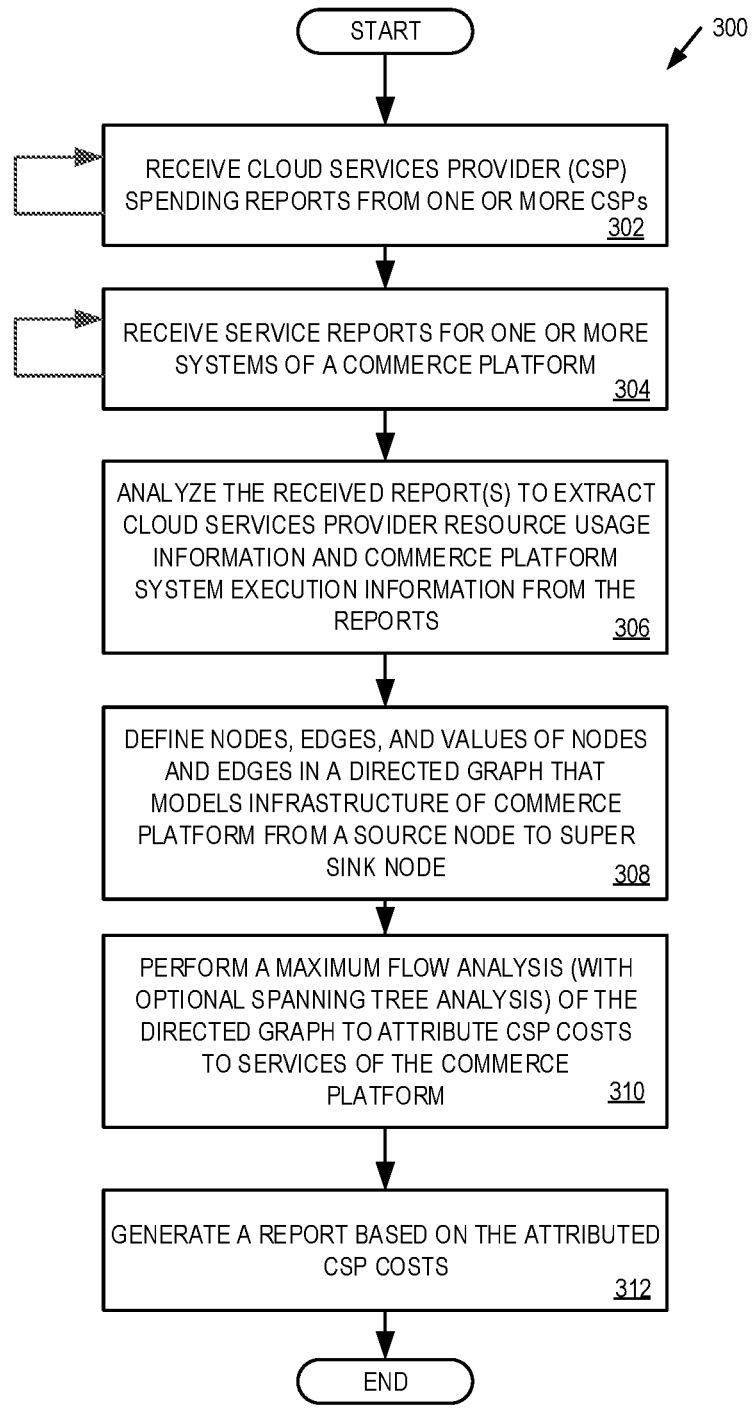
FIG. 3A is a block diagram of one embodiment of a process for modeling and analysis of infrastructure spending by a company on services provided by cloud services provider systems to the company.
Figure 3B:
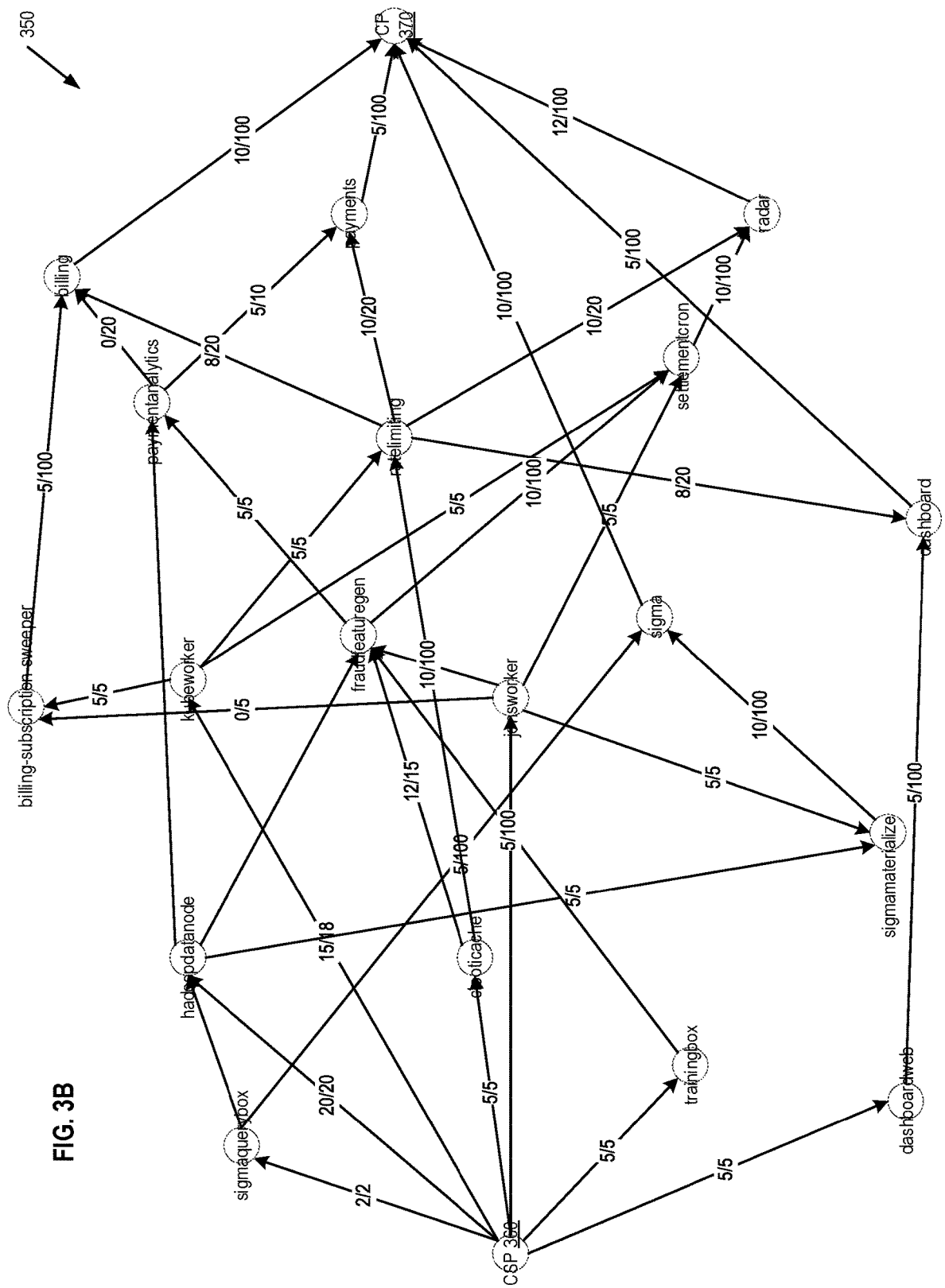
FIG. 3B is a block diagram of an embodiment of a graph for modeling and analysis of infrastructure spending by a company on services provided by cloud services provider systems to the company.

FIG. 3A is a block diagram of one embodiment of a process for modeling and analysis of infrastructure spending by a company on services provided by cloud services provider systems to the company. The process 300 is performed by processing logic that may comprise hardware (circuitry, dedicated logic, etc.), software (such as is run on a general-purpose computer system or a dedicated machine), firmware, or a combination thereof. In one embodiment, the process 300 is performed by a CSP analysis system 120 or 220.

Referring to FIG. 3A, processing logic begins by periodically receiving cloud services provider (CSP) spending reports from one or more CSPs (processing block 302) and periodically receive service reports from one or more systems of a commerce platform (processing block 304). In embodiments, the periodicity of processing block 302 and 304 may be different. Furthermore, processing block 302 and 304 may be performed by processing logic concurrently. In embodiments, processing logic performs an analysis of the received reports to extract cloud services provider resource usage information from the reports (processing block 306). In embodiments, processing logic utilizes text or other content analysis techniques for extracting information from the reports, such as SKUs/identifiers for use in defining nodes and edges in a flow graph, values associated with the SKUs/identifiers indicating clouds system usage (e.g., timestamps, indication of how a resource was consumed, etc., as discussed above), timestamps and/or other information indicating commerce platforms system usage (e.g., when a processes, products, code path, etc. was executed). In embodiments, the analysis enables processing logic to match the resource usage extracted from the cloud services provider reports with systems, code, processes, etc. of the commerce platform system extracted from the service reports, such as by using timestamp information, deployment location information, etc.

Processing logic then defines nodes, edges, and values of nodes and edges in a directed graph that models infrastructure of a commerce platform from a source node to a super sink node (processing block 308). As discussed herein, the nodes include a source node (e.g., a CSP system), a super sink node (e.g., a new node from which all existing sink nodes flow to), and a group of intermediate source and sink nodes representing the interconnected products, services, applications, etc., of the commerce platform's infrastructure. In embodiments, the labels for the nodes may be defined based on a commerce platform system(s) 110 known infrastructure. In other embodiments, the infrastructure nodes may be defined based on analysis of the analysis of the report to determine services, relationships, etc. at the cloud services provider system(s) 180 and what services, products, code paths, etc. of the commerce platform system 110 are responsible for utilizing those services. Furthermore, cost edges may be defined between nodes having properties including timestamp(s), a cloud component used (e.g. a source), a consumer (e.g., sink), an edge label (e.g., the SKU), and a cost (e.g., capacity of edge defined as amount x rate, such as amount of compute time consumed x compute time, amount of memory used x memory cost, etc.), as determined from the report analysis performed at processing block 306.

A maximum flow analysis, such as in embodiments using the Edmonds—Karp technique, is performed by processing logic to attribute CSP costs to units of the commerce platform (processing block 310). In embodiments, the primary metric for a flow analysis is the total cloud spend, which is the aggregate volume of dollars spent across all services of the commerce platform system(s) 110 (e.g., those used by customer systems, those that support customer systems, and those that generally support operations of the commerce platform's products/services). The flow analysis performed by processing logic can further track a secondary set of metrics associated with the service cost of each individual service of the commerce platform system(s) 110. Costs can continue to be broken down by processing logic as the flow is tracked across the graph. Therefore, for example, processing logic can track, based on analysis of the solved maximum flow problem from the flow graph, cloud spend across multiple dimensions:

Primary: total AWS cloud spend
Secondary: AWS→Hadoop spend (e.g., a process/function of the commerce platform at a CSP)
Tertiary: Hadoop spend→Individual Hadoop jobs (e.g. fraud scoring)
Quaternary: Hadoop jobs→Individual products (e.g. Radar)
Quinary: Stripe products→individual merchants/users In embodiments, as discussed herein, processing logic solves this problem (e.g., maximum flow through the flow graph defined for the products/services of the commerce platform) using, for example, the Edmonds-Karp technique. Using this technique, processing logic first identifies the edges of the graph that have only one consumer, and then apportions the service cost across each set of remaining nodes. Processing logic repeats this until a total cost for each product is established. Furthermore, in this process, each cloud component is a flow source, with a second flow source being the cloud service provider, and a tertiary flow source being a process (e.g., Hadoop). Additionally, each consumer is a sink, with a secondary sink being the process (e.g. Hadoop), and the tertiary sink being individual jobs of the process (e.g. a Hadoop job).

Processing logic then generates one or more reports based on the attributed CSP costs (processing block 312). For example, embodiments of a report includes a snapshot graphical user interface as illustrated in FIG. 6. As discussed herein, the reports may be generated for total cloud spend, product cloud spend, service cloud spend, code path cloud spend, team cloud spend, etc. based on tracing through the generated flow graph for which the maximum flow problem has been solved. In embodiments, the reports may be user interfaces (e.g., web based reports accessible to those within a commerce platform). In embodiments, the reports may comprise a data package (e.g., an XML document, a text based document, etc.) that are transmitted to a metrics tracking system of the commerce platform, which utilizes the data package to configure an interface of the metrics tracking system when rendering a summary/snapshot of the reported data. In embodiments, such data packages may further be used to configure systems of the cloud service provider, such as when a detected cloud spend increase from a prior report exceeds a threshold (E.g. increase of X, increase of Y %, etc.), such as by ingesting the data package by a system deployment element capable of modifying CSP deployments. Furthermore, the report and/or graphical user interface, in embodiments, is interactive enabling a user to specify a specific date or date range, specify a specific team or product of the commerce platform system(s), sort results by date, sort cloud services provider product/service spend attributable to a selected team/product by dollar amount, etc. Furthermore, the visual summary and data within the summary enables a user to locate potential dependencies in CSP products/services (e.g., when cloud spend for CSP service X jumps, service Y also jumps), trends over time, as well as other patterns that may be useful for analyzing cloud spend by the infrastructure of the commerce platform system(s). Additional reports, such as emails sent to selected email addresses and/or distribution lists may also be distributed by processing logic, for example, as periodic spending reports, on demand reports generated for/by specific users, in response to detection of specific cloud spend indicators (e.g., increase over a threshold amount, increase of a threshold percentage, as well as other factors), etc.

Figure 4:
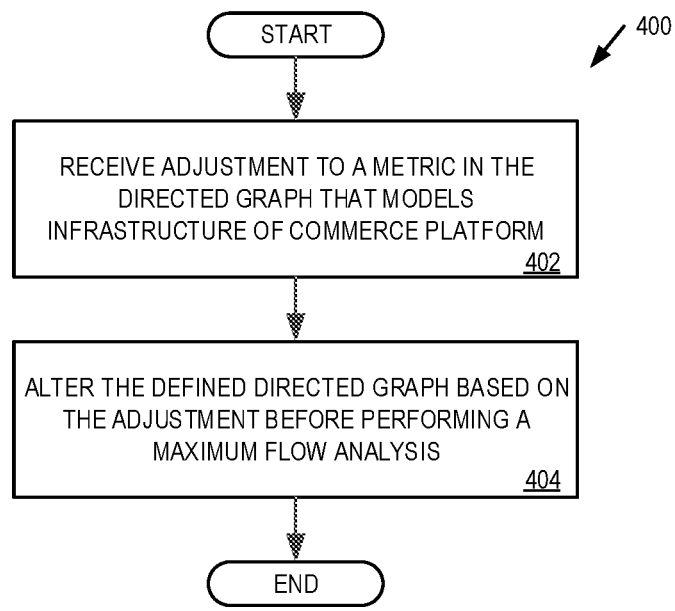
FIG. 4 is a block diagram of an embodiment of a process for using analysis of infrastructure spending by a company on services provided by cloud services provider systems to the company.

FIG. 4 is a block diagram of an embodiment of a process for using analysis of infrastructure spending by a company on services provided by cloud services provider systems to the company. The process 400 is performed by processing logic that may comprise hardware (circuitry, dedicated logic, etc.), software (such as is run on a general-purpose computer system or a dedicated machine), firmware, or a combination thereof. In one embodiment, the process 300 is performed by a CSP analysis system 120 or 220.

Referring to FIG. 4, processing logic begins by receiving an adjustment to a metric in the directed graph that models infrastructure of a commerce platform (processing block 402). As discussed herein, the received adjustment is a user specified change to one or more elements of the directed graph, such application of a weight to an edge in the directed graph.

Processing logic then alters the defined directed graph based on the adjustment before performing a maximum flow analysis (processing block 404). In embodiments, the altered directed graph is used to generate reports, as discussed herein, the results of which influence the behaviors of developers, project managers, planners, salespeople, etc. of the commerce platform. For example, weighting the cost of less efficient systems encourages teams within the commerce platform to move away from such inefficient systems. Similarly, weighting the cost of a less efficient process that performs the same task as another process encourages and/or directs those within the commerce platform to the more efficient process.

FIG. 5 is one embodiment of a computer system that may be used to support the systems and operations discussed herein. It will be apparent to those of ordinary skill in the art, however that other alternative systems of various system architectures may also be used.

The data processing system illustrated in FIG. 5 includes a bus or other internal communication means 515 for communicating information, and one or more processor(s) 510 coupled to the bus 515 for processing information. The system further comprises a random access memory (RAM) or other volatile storage device 550 (referred to as memory), coupled to bus 515 for storing information and instructions to be executed by processor(s) 510. Main memory 550 also may be used for storing temporary variables or other intermediate information during execution of instructions by processor(s) 510. The system also comprises a read only memory (ROM) and/or static storage device 520 coupled to bus 515 for storing static information and instructions for processor(s) 510, and a data storage device 525 such as a magnetic disk or optical disk and its corresponding disk drive. Data storage device 525 is coupled to bus 515 for storing information and instructions.

The system may further be coupled to a display device 570, such as a light emitting diode (LED) display or a liquid crystal display (LCD) coupled to bus 515 through bus 565 for displaying information to a computer user. An alphanumeric input device 575, including alphanumeric and other keys, may also be coupled to bus 515 through bus 565 for communicating information and command selections to processor(s) 510. An additional user input device is cursor control device 580, such as a touchpad, mouse, a trackball, stylus, or cursor direction keys coupled to bus 515 through bus 565 for communicating direction information and command selections to processor 510, and for controlling cursor movement on display device 570.

Another device, which may optionally be coupled to computer system 500, is a communication device 590 for accessing other nodes of a distributed system via a network. The communication device 590 may include any of a number of commercially available networking peripheral devices such as those used for coupling to an Ethernet, token ring, Internet, or wide area network. The communication device 590 may further be a null-modem connection, or any other mechanism that provides connectivity between the computer system 500 and the outside world. Note that any or all of the components of this system illustrated in FIG. 5 and associated hardware may be used in various embodiments as discussed herein.

It will be apparent to those of ordinary skill in the art that the system, method, and process described herein can be implemented as software stored in main memory or read only memory and executed by processor. This control logic or software may also be resident on an article of manufacture comprising a non-transitory computer readable medium having computer readable program code embodied therein and being readable by the mass storage device and for causing the processor to operate in accordance with the methods and teachings herein.

The embodiments discussed herein may also be embodied in a handheld or portable device containing a subset of the computer hardware components described above. For example, the handheld device may be a mobile telephone, tablet computer, special purpose computer device, etc. configured to contain only the bus, the processor, and memory. The handheld device may also be configured to include a set of buttons or input signaling components with which a user may select from a set of available options. The handheld device may also be configured to include an output apparatus such as a liquid crystal display (LCD) or display element matrix for displaying information to a user of the handheld device. Conventional methods may be used to implement such a handheld device. The implementation of embodiments for such a device would be apparent to one of ordinary skill in the art given the disclosure as provided herein.

The embodiments discussed herein may also be embodied in a special purpose appliance including a subset of the computer hardware components described above. For example, the appliance may include a processor, a data storage device, a bus, and memory, and only rudimentary communications mechanisms, such as a small touch-screen that permits the user to communicate in a basic manner with the device. In general, the more special-purpose the device is, the fewer of the elements need be present for the device to function.

Although the present application has been described with reference to the services and/or products of a commerce platform system deployed using the resources of cloud services provider system(s), the embodiments of the present invention are not limited to commerce platform cloud infrastructure spending modeling, analysis, and usage. In embodiments, any company, organization, university, etc. that utilizes resources of a cloud services provider system to deploy, manage, or otherwise support their operations may utilize the systems, methods, and techniques discussed herein.

It will be appreciated by those of ordinary skill in the art that any configuration of the system may be used for various purposes according to the particular implementation. The control logic or software implementing the described embodiments can be stored in main memory, mass storage device, or other storage medium locally or remotely accessible to processor.

It is to be understood that the above description is intended to be illustrative, and not restrictive. Many other embodiments will be apparent to those of skill in the art upon reading and understanding the above description. The scope should, therefore, be determined with reference to the appended claims, along with the full scope of equivalents to which such claims are entitled.

The foregoing description, for purpose of explanation, has been described with reference to specific embodiments. However, the illustrative discussions above are not intended to be exhaustive or to limit the described embodiments to the precise forms disclosed. Many modifications and variations are possible in view of the above teachings. The embodiments were chosen and described in order to best explain the principles and practical applications of the various embodiments, to thereby enable others skilled in the art to best utilize the various embodiments with various modifications as may be suited to the particular use contemplated.

What is claimed is:

1. A computer implemented method for tracking usage of computer resources of a cloud computing system to model infrastructure provided by the cloud computing system, the computer-implemented method comprising:

measuring, by a cloud services provider analysis system, the usage of the computer resources of the infrastructure provided by the cloud computing system, wherein the computer resources comprises at least one of: a central processing unit time, data storage, a volume of requests, and job execution time;

monitoring, by the cloud services provider analysis system, a number of different time series streams to track the usage of the computer resources corresponding to a plurality of interconnected products of a service provider utilizing the cloud computing system to provide services to users of the service provider;

constructing, by the cloud services provider analysis system, a flow network graph which models the usage of the computer resources of the infrastructure pumped through said cloud computing infrastructure, wherein the flow network graph comprises a spanning tree of the interconnected products of the service provider;

identifying, by the cloud services provider analysis system using the flow network graph, technical dependencies between the interconnected products not reflected through internal communication channels corresponding to a predefined organizational structure of the service provider to ensure that upgrades are made on said cloud computing infrastructure based on respective code artifacts traced by the cloud provider analysis system as corresponding to the interconnected products;

analyzing, by the cloud services provider analysis system, the spanning tree comprised in the flow network graph that models the usage of the computer resources of the infrastructure to attribute the usage of the computer resources of the infrastructure provided by the cloud computing system to the interconnected products based at least in part on the identified technical dependencies;

generating, by the cloud services provider analysis system, after performing the analysis of the spanning tree, a report to enable the cloud services provider analysis system to: periodically change deployments of the interconnected products to reduce the usage of the computer resources by actively configuring the interconnected products when increases in a subset usage of a subset of the computer resources attributed to the interconnected products exceed one or more corresponding preset thresholds.

2. The computer implemented method of claim 1, wherein the flow network graph comprises a directed graph, and the analysis of the spanning tree comprised in the flow network graph comprises solving a maximum flow analysis for the flow network graph.

3. The computer implemented method of claim 2, wherein the directed graph comprises a source node associated with the cloud computing system, a super sink node associated with the service provider, and a plurality of intermediate nodes that represent the infrastructure provided by the cloud computing system and are associated with the interconnected products of the service provider, and wherein edges between any two nodes in the directed graph are directed and are labeled with a timestamp, a type of cloud service, a consumer of the cloud service, an identifier of the cloud service, and a specific resource usage consumed between the two nodes.

4. The computer implemented method of claim 3, wherein the analyzing further comprises:

performing the maximum flow analysis using the directed graph to determine the usage of the computer resources of the infrastructure provided by the cloud computing system across the directed graph, wherein the directed graph is decomposed into a plurality of spanning trees during the maximum flow analysis for attributing costs to individual ones of the interconnected products, software development groups, customers of the service provider, or a combination thereof.

5. The computer implemented method of claim 1, further comprising:
generating a graphical user interface that displays the report on a user system associated with the service provider.

6. The computer implemented method of claim 1, wherein data indicative of the usage of the computer resources of the infrastructure provided by the cloud computing system comprises information indicative of execution of the interconnected products over a period of time.

7. The computer implemented method of claim 6, wherein the information indicative of execution of the interconnected products over the period of time is generated by a service execution tracking system of the service provider.

8. The computer implemented method of claim 1, wherein the flow network graph is generated for one of the users of the service provider, and the monitored usage of the computer resources are attributable to particular products of the interconnected products of the service provider consumed by the one of the users of the service provider.

9. The computer implemented method of claim 1, wherein the service provider comprises a commerce platform system, and the interconnected products comprise systems of the commerce platform system that provide the services to the users of the commerce platform system.

10. A non-transitory computer readable storage medium having instructions stored thereon, which when executed by a hardware processor of a cloud services provider analysis system, causes the hardware processor to perform operations to track usage of computer resources of a cloud computing system to model infrastructure provided by the cloud computing system, the operations comprising:
measuring, the usage of the computer resources of the infrastructure provided by the cloud computing system, wherein the computer resources comprises at least one of: a central processing unit time, data storage, a volume of requests, and job execution time;
monitoring, a number of different time series streams to track the usage of the computer resources corresponding to a plurality of interconnected products of a service provider utilizing the cloud computing system to provide services to users of the service provider;
constructing, a flow network graph which models the usage of the computer resources of the infrastructure pumped through said cloud computing infrastructure, wherein the flow network graph comprises a spanning tree of the interconnected products of the service provider;
identifying using the flow network graph, technical dependencies between the interconnected products not reflected through internal communication channels corresponding to a predefined organizational structure of the service provider to ensure that upgrades are made on said cloud computing infrastructure based on respective code artifacts traced by the cloud provider analysis system as corresponding to the interconnected products;
analyzing the spanning tree comprised in the flow network graph that models the usage of the computer resources of the infrastructure to attribute the usage of the computer resources of the infrastructure provided by the cloud computing system to the interconnected products based at least in part on the identified technical dependencies;
generating, after performing the analysis of the spanning tree, a report to enable the cloud services provider analysis system to: periodically change deployments of the interconnected products to reduce the usage of the computer resources by actively configuring the interconnected products when increases in a subset usage of a subset of the computer resources attributed to the interconnected products exceed one or more corresponding preset thresholds.

11. The non-transitory computer readable storage medium of claim 10, wherein the flow network graph comprises a directed graph, and the analysis of the spanning tree comprised in the flow network graph comprises solving a maximum flow analysis for the flow network graph.

12. The non-transitory computer readable storage medium of claim 11, wherein the directed graph comprises a source node associated with the cloud computing system, a super sink node associated with the service provider, and a plurality of intermediate nodes that represent the infrastructure provided by the cloud computing system and are associated with the interconnected products of the service provider, and wherein edges between any two nodes in the directed graph are directed and are labeled with a timestamp, a type of cloud service, a consumer of the cloud service, an identifier of the cloud service, and a specific resource usage consumed between the two nodes.

13. The non-transitory computer readable storage medium of claim 12, wherein the analyzing further comprises:
performing the maximum flow analysis using the directed graph to determine the usage of the computer resources of the infrastructure provided by the cloud computing system across the directed graph, wherein the directed graph is decomposed into a plurality of spanning trees during the maximum flow analysis for attributing costs to individual ones of the interconnected products, software development groups, customers of the service provider, or a combination thereof.

14. The non-transitory computer readable storage medium of claim 10, further comprising:
generating a graphical user interface that displays the report on a user system associated with the service provider.

15. The non-transitory computer readable storage medium of claim 10, wherein data indicative of the usage of the computer resources of the infrastructure provided by the cloud computing system comprises information indicative of execution of the interconnected products over a period of time.

16. The non-transitory computer readable storage medium of claim 15, wherein the information indicative of execution of the interconnected products over the period of time is generated by a service execution tracking system of the service provider.

17. The non-transitory computer readable storage medium of claim 10, wherein the flow network graph is generated for one of the users of the service provider, and the monitored usage of the computer resources are attributable to particular products of the interconnected products of the service provider consumed by the one of the users of the service provider.

18. The non-transitory computer readable storage medium of claim 10, wherein the service provider comprises a commerce platform system, and the interconnected products comprise systems of the commerce platform system that provide the services to the users of the commerce platform system.

19. A system for tracking usage of computer resources of a cloud computing system to model infrastructure provided by the cloud computing system, the system comprising: a hardware memory that stores one or more instructions; and a hardware processor, of a cloud services provider analysis system, and coupled with the hardware memory to execute the one or more instructions to perform operations, comprising:

measuring, the usage of the computer resources of the infrastructure provided by the cloud computing system, wherein the computer resources comprises at least one of: a central processing unit time, data storage, a volume of requests, and job execution time;

monitoring, a number of different time series streams to track the usage of the computer resources corresponding to a plurality of interconnected products of a service provider utilizing the cloud computing system to provide services to users of the service provider;

constructing, a flow network graph which models the usage of the computer resources of the infrastructure pumped through said cloud computing infrastructure, wherein the flow network graph comprises a spanning tree of the interconnected products of the service provider;

identifying using the flow network graph, technical dependencies between the interconnected products not reflected through internal communication channels corresponding to a predefined organizational structure of the service provider to ensure that upgrades are made on said cloud computing infrastructure based on respective code artifacts traced by the cloud services provider analysis system as corresponding to the interconnected products;

analyzing the spanning tree comprised in the flow network graph that models the usage of the computer resources of the infrastructure to attribute the usage of the computer resources of the infrastructure provided by the cloud computing system to the interconnected products based at least in part on the identified technical dependencies;

generating, after performing the analysis of the spanning tree, a report to enable the cloud services provider analysis system to: periodically change deployments of the interconnected products to reduce the usage of the computer resources by actively configuring the interconnected products when increases in a subset usage of a subset of the computer resources attributed to the interconnected products exceed one or more corresponding preset thresholds.

20. The system of claim 19, wherein the service provider comprises a commerce platform system, and the interconnected products comprise systems of the commerce platform system that provide the services to the users of the commerce platform system.

* * * * *